(12) United States Patent
Umetsu et al.

(10) Patent No.: US 11,035,888 B2
(45) Date of Patent: Jun. 15, 2021

(54) CURRENT SENSOR

(71) Applicant: Hitachi Metals, Ltd., Tokyo (JP)

(72) Inventors: Jun Umetsu, Tokyo (JP); Naoki Futakuchi, Tokyo (JP); Haruyasu Komano, Tokyo (JP); Ken Okuyama, Tokyo (JP); Yujiro Tomita, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 251 days.

(21) Appl. No.: 16/208,890

(22) Filed: Dec. 4, 2018

(65) Prior Publication Data

US 2019/0187187 A1    Jun. 20, 2019

(30) Foreign Application Priority Data

Dec. 14, 2017    (JP) .............................. JP2017-240048

(51) Int. Cl.
| | |
|---|---|
| *G01R 33/00* | (2006.01) |
| *G01R 19/00* | (2006.01) |
| *H01R 25/16* | (2006.01) |
| *G01R 15/20* | (2006.01) |
| *G01R 1/04* | (2006.01) |

(Continued)

(52) U.S. Cl.
CPC .......... *G01R 19/0092* (2013.01); *G01R 1/04* (2013.01); *G01R 15/148* (2013.01); *G01R 15/207* (2013.01); *G01R 31/315* (2013.01); *G01R 33/02* (2013.01); *H01R 25/16* (2013.01); *G01N 17/02* (2013.01); *G01N 27/82* (2013.01); *G01N 27/83* (2013.01); *G01N 27/9046* (2013.01)

(58) Field of Classification Search
CPC .... G01N 27/83; G01N 27/82; G01N 27/9046; G01N 17/02; G01R 15/148; G01R 33/02; G01R 15/207; G01R 31/315; G01R 19/0092; G01R 1/04; G01R 15/20; G01R 15/202; G01R 15/205; H01R 25/16
USPC .................... 324/51, 55, 200, 217, 228, 263
See application file for complete search history.

(56) References Cited

U.S. PATENT DOCUMENTS

| | | | |
|---|---|---|---|
| 2019/0170793 A1* | 6/2019 | Okuyama | G01R 15/148 |
| 2019/0170795 A1* | 6/2019 | Sugito | G01R 33/0047 |

(Continued)

FOREIGN PATENT DOCUMENTS

| | | |
|---|---|---|
| EP | 3176590 A1 | 6/2017 |
| JP | 2015-194349 A | 11/2015 |
| JP | 2017-102024 A | 6/2017 |

OTHER PUBLICATIONS

Office Action issued in the corresponding Japanese Patent Application No. 2017-240048 dated Apr. 20, 2021.

*Primary Examiner* — Raul J Rios Russo
(74) *Attorney, Agent, or Firm* — Roberts Calderon Safran & Cole P.C.

(57) ABSTRACT

A current sensor includes a bus bar in which a current to be detected flows, a circuit board mounted with a magnetic detection element thereon to detect a strength of a magnetic field generated by a current flowing in the bus bar, and a housing including first and second housings provided in such a manner as to sandwich the bus bar and the circuit board therebetween in a plate thickness direction of the bus bar. The first and second housings include slide guide portions respectively which are relatively slidable in a sloping direction with respect to the plate thickness direction of the bus bar while abutting each other in the plate thickness direction of the bus bar.

11 Claims, 10 Drawing Sheets

(51) Int. Cl.
    *G01R 15/14*     (2006.01)
    *G01R 33/02*     (2006.01)
    *G01R 31/315*     (2006.01)
    *G01N 27/83*     (2006.01)
    *G01N 27/82*     (2006.01)
    *G01N 27/90*     (2021.01)
    *G01N 17/02*     (2006.01)

(56) References Cited

U.S. PATENT DOCUMENTS

| | | | |
|---|---|---|---|
| 2019/0234996 A1* | 8/2019 | Nomura | H01L 23/04 |
| 2020/0059127 A1* | 2/2020 | Yamashita | H02K 3/522 |
| 2020/0150155 A1* | 5/2020 | Sakai | G01R 15/20 |
| 2020/0300895 A1* | 9/2020 | Tamura | G01R 15/202 |
| 2020/0300896 A1* | 9/2020 | Tamura | G01R 19/0092 |

\* cited by examiner

CURRENT SENSOR

CROSS-REFERENCE TO RELATED APPLICATION

The present application is based on Japanese patent application No. 2017-240048 filed on Dec. 14, 2017, the entire contents of which are incorporated herein by reference.

BACKGROUND OF THE INVENTION OF THE INVENTION

1. Field of the Invention

The present invention relates to a current sensor.

2. Description of the Related Art

Conventionally, there is known a current sensor including a magnetic detection element for detecting the strength of a magnetic field generated by a current to be measured. By detecting the strength of the magnetic field by the magnetic detection element, it is possible to calculate the current based on the strength of the magnetic field. As the current sensor of this type, there is known one in which a bus bar serving as a current path and a magnetic detection element are covered with a housing (see, e.g., JP-A-2017-102024).

In the current sensor, it is desirable to minimize the positional misalignment of the magnetic detection element with respect to the bus bar. When disposing the magnetic sensing element opposite the bus bar in a plate thickness direction, the distance between the bus bar and the magnetic detection element along the plate thickness direction needs to be kept constant. Therefore, it is considered that, by bringing the bus bar and the circuit board into contact with each other directly or indirectly via a spacer or the like, and applying a predetermined pressing force in the plate thickness direction of the bus bar with the upper and lower housings that sandwich the bus bar and the circuit board therebetween (by fixing the upper and lower housings to each other with a pressing force applied thereto), the distance between the bus bar and the magnetic detection element is held constant.

SUMMARY OF THE INVENTION

However, in the above current sensor, when the upper and lower housings are in contact with each other in the plate thickness direction, a gap forms within the housings due to manufacturing tolerance and the like, and no sufficient pressing force may be applied to between the bus bar and the circuit board. This is because the plurality of the members such as the bus bar, the circuit board, the spacer, the upper and lower housings, etc. are stacked, therefore the influences of the tolerances of each member accumulate, leading to the high possibility of the gap formation within the housings.

The inventors of the present invention have examined to prevent the upper and lower housings from contacting each other (examined such a configuration as to form a gap between the upper and lower housings during the stacking). As a result, it is possible to absorb the influences of the tolerances of each member and apply the pressing force to between the bus bar and the circuit board. In this case, however, when the upper and lower housings are fixed together by bolt fixation or the like, the housings may be dented and deformed in the gap portion. When the housings are deformed, the pressing force is biased, floating occurs in a portion where the pressing force is weak, and the members tilt, so the positional misalignment between the bus bar and the magnetic detecting element may occur.

It is therefore an object of the present invention to provide a current sensor capable of suppressing the positional misalignment between a bus bar and a magnetic detection element.

In order to solve the above problem, the present invention provides a current sensor, comprising:

a bus bar in which a current to be detected flows;

a circuit board mounted with a magnetic detection element thereon to detect a strength of a magnetic field generated by a current flowing in the bus bar; and a housing including first and second housings provided in such a manner as to sandwich the bus bar and the circuit board therebetween in a plate thickness direction of the bus bar, wherein the first and second housings include slide guide portions respectively which are relatively slidable in a sloping direction with respect to the plate thickness direction of the bus bar while abutting each other in the plate thickness direction of the bus bar.

Points of the Invention

According to the present invention, it is possible to provide the current sensor capable of suppressing the positional misalignment between the bus bar and the magnetic detection element.

DETAILED DESCRIPTION OF THE PREFERRED EMBODIMENTS

Embodiment

An embodiment of the present invention will be described below with reference to the accompanying drawings.

Figure 1A:
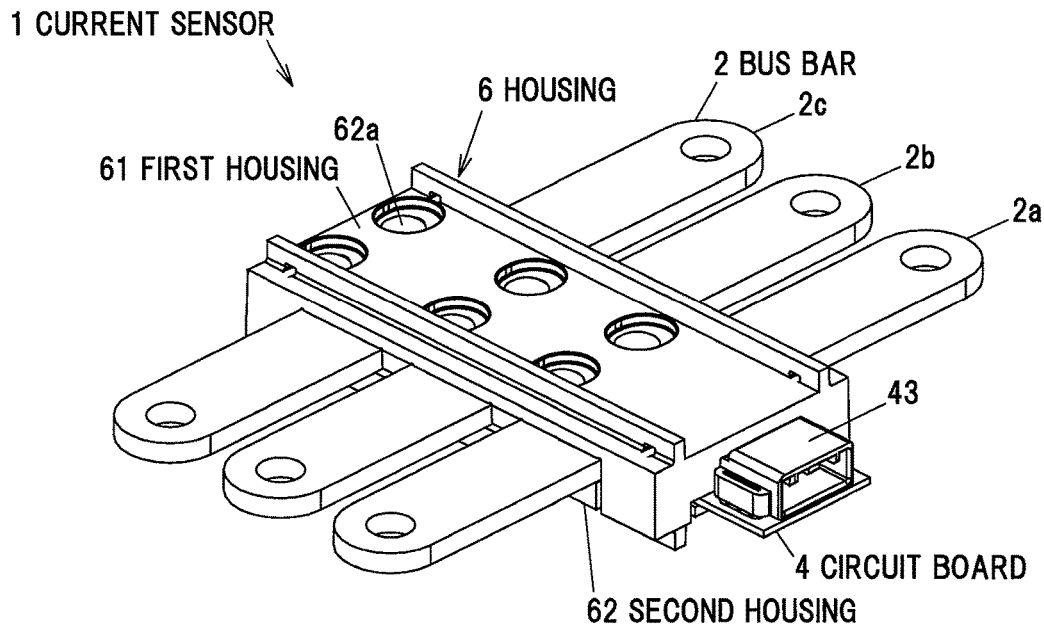
FIGS. 1A and 1B are perspective views showing a current sensor according to one embodiment of the present invention.
Figure 1B:
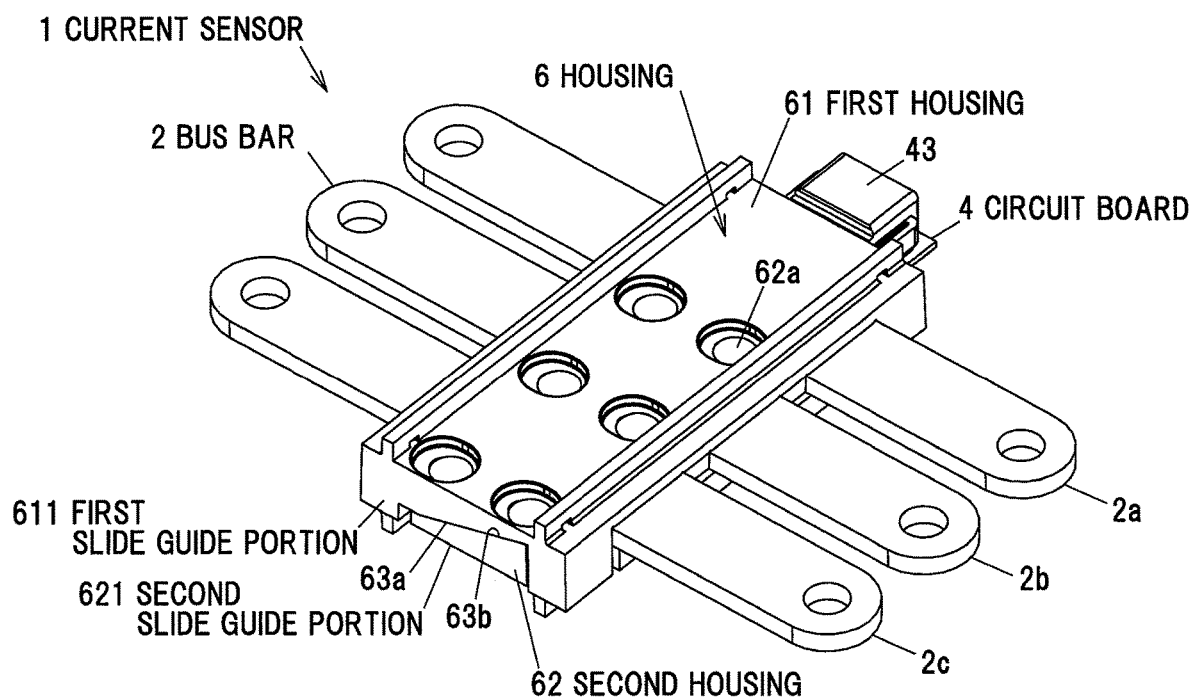
Figure 2:
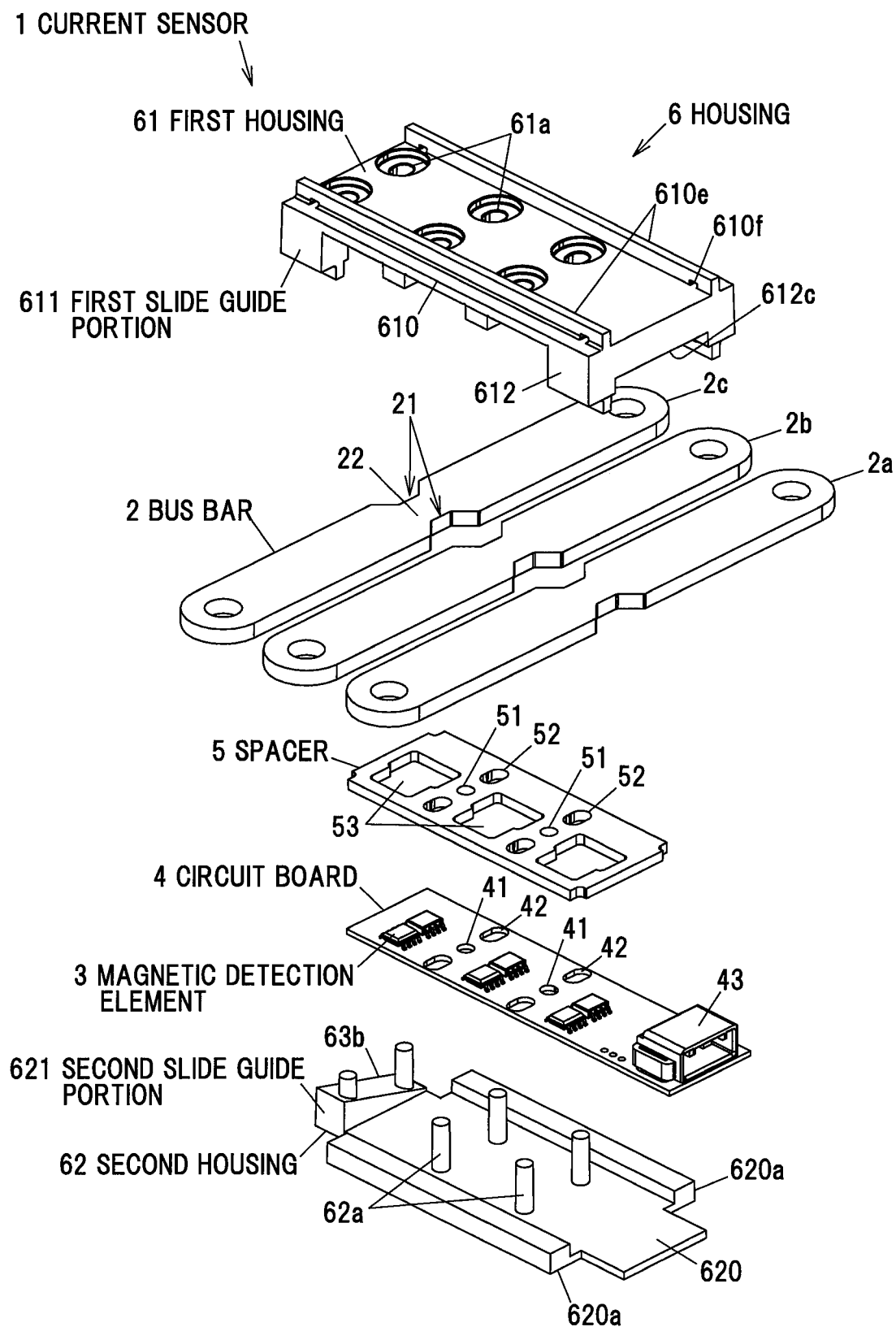
FIG. 2 is an exploded perspective view of the current sensor.
Figure 3:
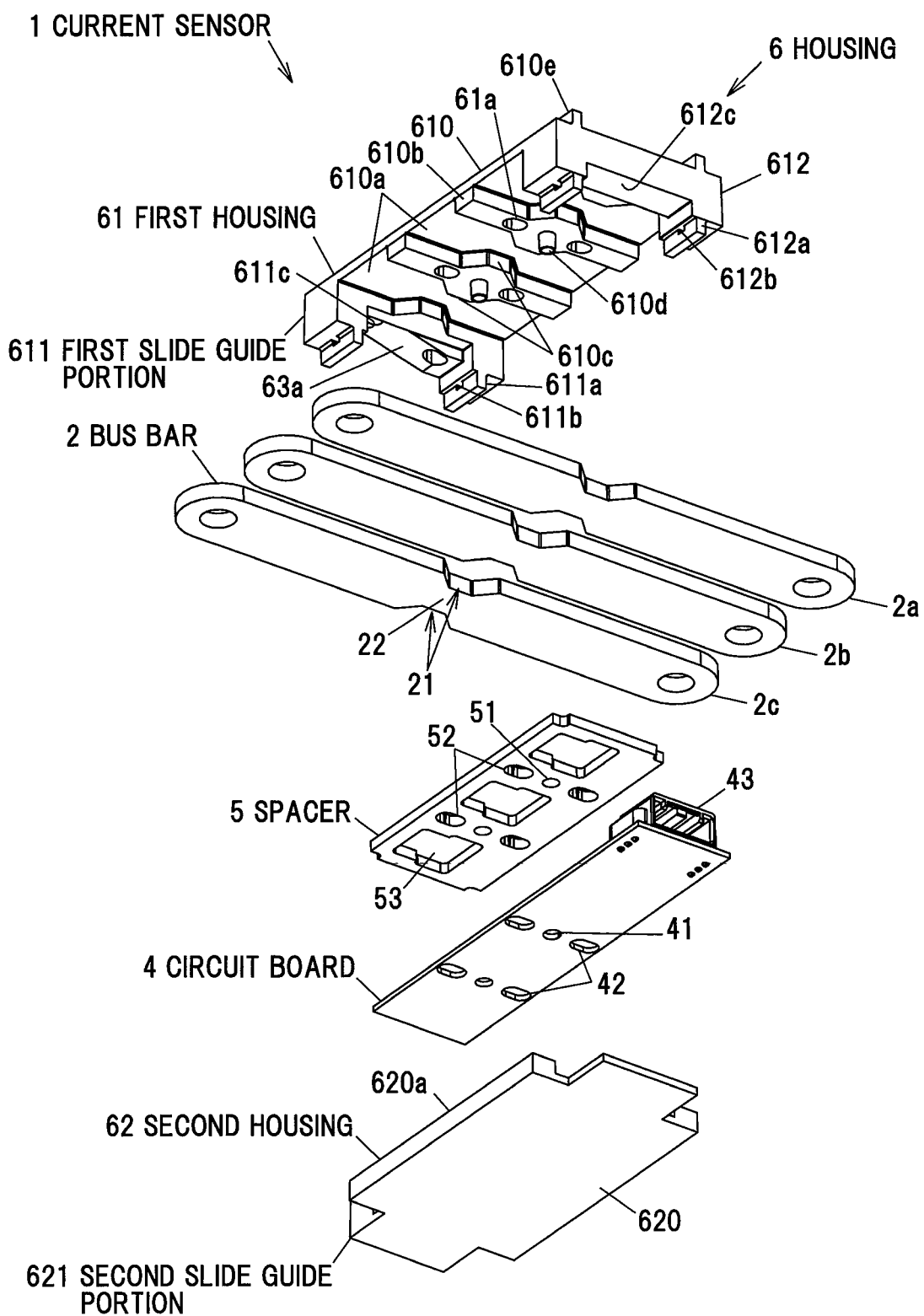
FIG. 3 is an exploded perspective view of the current sensor.

FIGS. 1A and 1B are perspective views showing a current sensor according to one embodiment of the present invention. FIGS. 2 and 3 are exploded perspective views of the current sensor.

As shown in FIGS. 1A to 3, the current sensor 1 includes a bus bar 2 in which a current to be detected flows, a magnetic detection element 3, a circuit board 4 on which the magnetic detection element 3 is mounted, a spacer 5, and a housing 6 having a structure divided into two halves: a first housing 61 and a second housing 62. Note that in FIGS. 1A to 3, a shield plate 7 to be described later is omitted (see FIG. 7).

(Explanation of Bus Bar 2)

The bus bar 2 is a plate-like conductor made of a good electric conductor such as copper or aluminum, and serves as an electric current path in which electric current flows. The bus bar 2 is for use as, e.g., a power supply line between a motor and an inverter in an electric vehicle or a hybrid vehicle. In the present embodiment, a case where three bus bars 2 corresponding to three-phase alternating currents are used will be described. However, the number of the bus bars 2 is not limited to this. The thicknesses of the bus bars 2 are, e.g., 3 mm. The three bus bars 2a to 2c are arranged in such a manner as to be aligned and spaced apart in a plate width direction.

Each of bus bars 2a to 2c is formed with respective two cutouts 21. The two cutouts 21 are formed in such a manner as to be open towards both sides respectively in the plate width direction of each of bus bars 2a to 2c, and are formed opposite each other substantially at the same positions in a length direction. By forming the two cutouts 21 on each of bus bars 2a to 2c, a narrow width portion 22 in which a part in a longitudinal direction of the bus bars 2a to 2c is narrowed in width is formed. In the present embodiment, the magnetic detection element 3 is disposed in such a manner as to face the narrow width portion 22 in the thickness direction.

The narrow width portion 22 acts to suppress the influence of the skin effect at high frequencies and contributes to improvement in detection accuracy. More specifically, when a high frequency current flows in the bus bar 2, the current distribution is biased toward the surface of the bus bar 2 due to the skin effect. Since the skin thickness differs depending on the frequency and the current distribution inside the bus bar 2 changes, the magnetic flux density at the position of the magnetic detection element 3 changes. In the case where the magnetic detection element 3 is arranged in such a manner as to face the middle portion in the width direction of the bus bar 2, it is considered that the smaller the aspect ratio of the cross sectional shape of the conduction surface of the bus bar 2 as viewed from the magnetic detection element 3 side, the smaller the extent of the current distribution (in other words, the frequency dependency of the current distribution), and the smaller the influence of the skin effect.

(Description of Magnetic Detecting Element 3 and Circuit Board 4)

The magnetic detection element 3 is for detecting a strength of a magnetic field generated by the currents flowing in the corresponding bus bars 2a to 2c. Here is shown a case that a total of six of the magnetic detection elements 3 are used, two of the magnetic detection elements 3 used for each bus bar 2. It should be noted, however, that the present invention is not limited to this, but may be configured in such a manner that one magnetic detection element 3 is used for each bus bar 2. As the magnetic detection element 3, e.g., a Hall element, a GMR (Giant Magneto Resistive Effect) element, an AMR (Anisotropic Magneto Resistive) element, a TMR (Tunneling Magneto Resistive) element, or the like can be used.

The magnetic detection elements 3 are configured to output an output signal having a voltage corresponding to the strength of the magnetic field (magnetic flux density) in the direction along the detection axis. In the present embodiment, each magnetic detection element 3 is arranged in such a manner that the detection axis coincides with the plate width direction of the bus bars 2.

Each magnetic detection element 3 is mounted on the common circuit board 4. The circuit board 4 is formed with two positioning holes 41 for positioning with respect to the first housing 61. The circuit board 4 is also formed with an elongated hole 42 for a heat staking protrusion (heat caulking protrusion) 62a of the second housing 62 to be passed therethrough. As will be described in detail later, in this embodiment, at the time of assembly, the second housing 62 is slid relative to the first housing 61 (and the circuit board 4 fixed to the first housing 61) in a direction perpendicular to the plate width direction of the bus bars 2. Therefore, the elongated hole 42 is formed in an oval shape (rounded corner rectangular shape) extending in the longitudinal direction of the bus bars 2 so that the heat staking protrusion 62a can be slid with respect to the circuit board 4. Both the positioning hole 41 and the elongated hole 42 are formed in such a manner as to penetrate the circuit board 4 in the plate thickness direction. An end portion of the circuit board 4 is provided with a connector 43, which is used for power supply, detection signal outputting of the magnetic detection elements 3, and the like.

(Explanation of Spacer 5)

Figure 4:
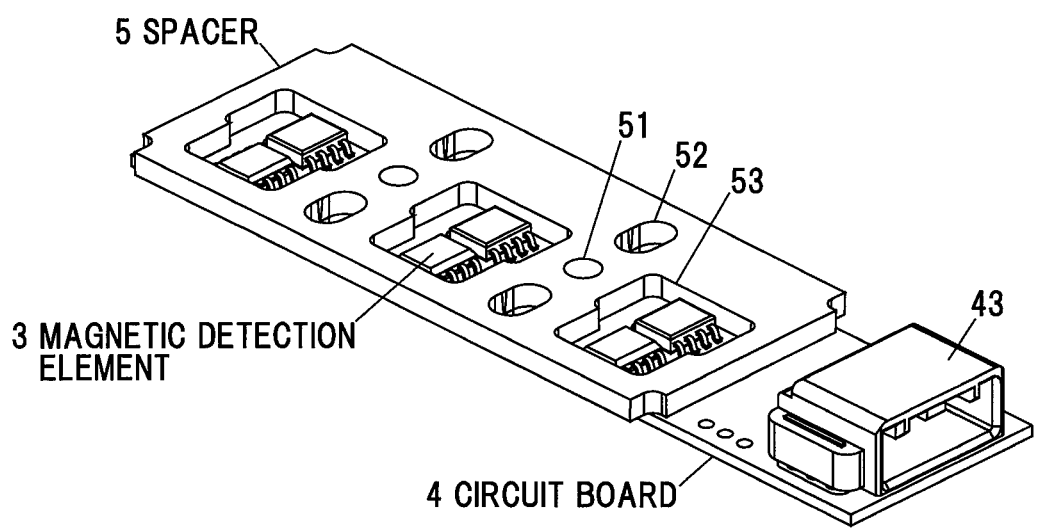
FIG. 4 is a perspective view of a spacer and a circuit board.

FIG. 4 is a perspective view of the spacer 5 and the circuit board 4. The spacer 5 is provided between the bus bars 2 and the circuit board 4 and is for maintaining the bus bars 2 and the circuit board 4 (magnetic detection elements 3) at a predetermined distance therebetween. The spacer 5 is made of a resin such as PPS (polyphenylene sulfide), PBT (polybutylene terephthalate) or the like, and is formed in a plate shape.

The spacer 5 is formed with two positioning holes 51 for positioning with respect to the first housing 61. In addition, the spacer 5 is formed with an elongated hole 52 for the heat staking protrusion 62a of the second housing 62 to be passed therethrough. The elongated hole 52 is formed in an oval shape (rounded corner rectangular shape) extending in the longitudinal direction of the bus bars 2 so that the heat staking protrusion 62a can be slid with respect to the spacer 5. Further, the spacer 5 is formed with three accommodation holes 53 for accommodating the magnetic detection elements 3. In each accommodation hole 53, two magnetic detection elements 3 are accommodated. The positioning hole 51, the elongated hole 52 and the accommodation hole 53 are all formed in such a manner as to penetrate the spacer 5 in the plate thickness direction.

(Description of Housing 6)

Figure 5A:
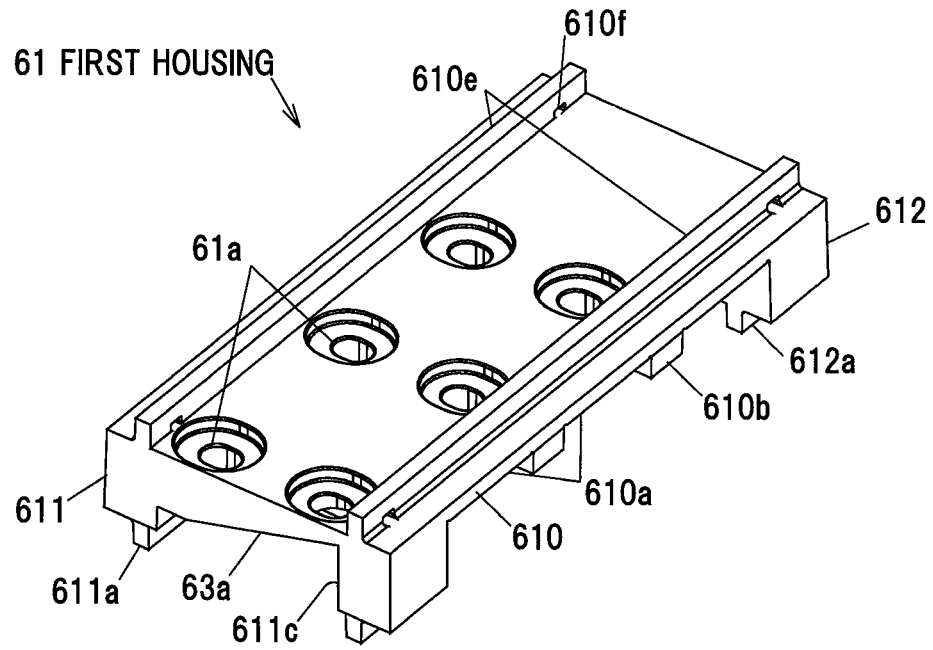
FIGS. 5A and 5B are perspective views of a first housing.
Figure 5B:
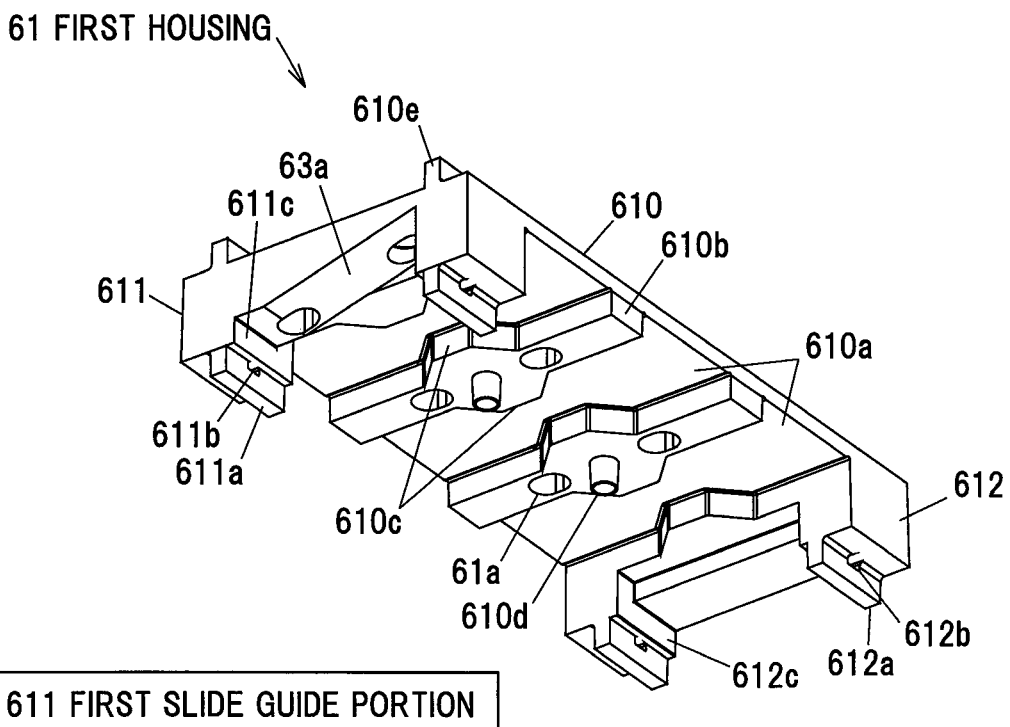
Figure 6:
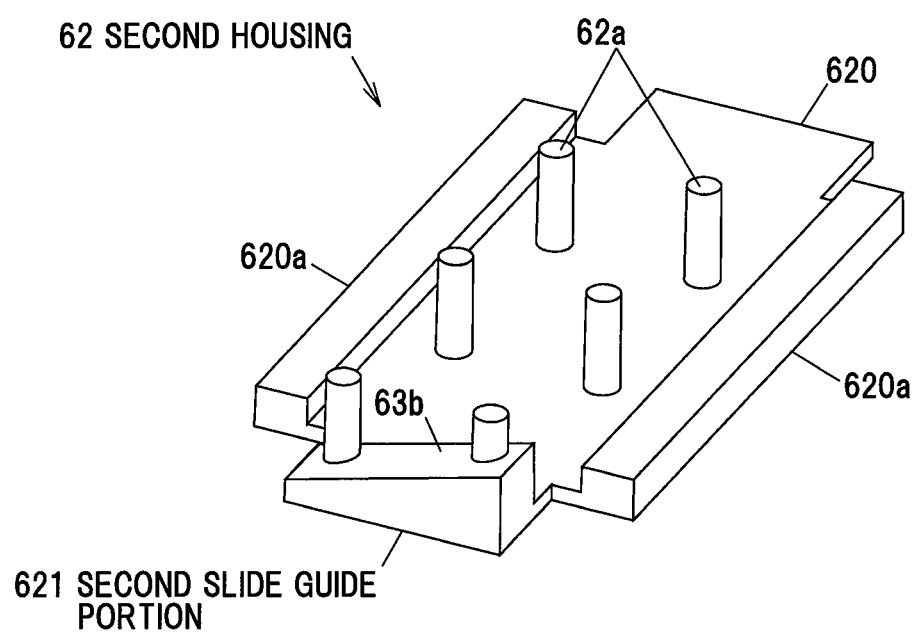
FIG. 6 is a perspective view of a second housing.

FIGS. 5A and 5B are perspective views of the first housing 61. FIG. 6 is a perspective view of the second housing 62. The housing 6 has the first and second housings 61 and 62 provided in such a manner as to sandwich the bus bars 2, the circuit board 4, and the spacer 5 therebetween in the plate thickness direction of the bus bars 2. The first and second housings 61 and 62 are provided in such a manner as to sandwich the three bus bars 2 and the circuit board 4 together therebetween. The first housing 61 and the second housing 62 are made of a resin such as PPS (polyphenylene sulfide) or PBT (polybutylene terephthalate).

As shown in FIGS. 5A and 5B, the first housing 61 integrally includes an upper lid portion 610 formed with a bus bar accommodating groove 610a for accommodating the bus bars 2, a first slide guide portion 611 provided on one side of the upper lid portion 610 in the plate width direction of the bus bars 2 and a side wall portion 612 provided on the other side of the upper lid portion 610 in the plate width direction of the bus bars 2. In the following, for ease of explanation, the upper side of FIGS. 5A and 5B will be referred to as the upper side and the lower side of FIGS. 5A and 5B will be referred to as the lower side. Note that these upper and lower directions do not represent the upper and lower sides in the use state of the current sensor 1, and the installation posture of the current sensor 1 can be appropriately set.

On the lower surface (the surface on the second housing 62 side) of the upper lid portion 610, three bus bar receiving grooves 610a are formed at an equal pitch in such a manner as to extend in a direction perpendicular to the opposing direction of the first slide guide portion 611 and the side wall portion 612. Two projecting portions 610b projecting downward are formed between the bus bar receiving grooves 610a. The projecting portions 610b have a projected portion 610c which projects into the bus bar accommodating grooves 610a to be mated to the cutouts 21 of the bus bars 2. By mating the projected portions 610c to the cutouts 21 of the bus bars 2, positioning of the bus bars 2 with respect to the first housing 61 is performed.

Further, each of the two projecting portions 610b is formed with a positioning protrusion 610d protruding downward. By inserting both the positioning protrusions 610d into the positioning holes 41 and 51 of the spacer 5 and the circuit board 4, positioning of the spacer 5 and the circuit board 4 with respect to the first housing 61 is performed.

On the upper surface of the upper lid portion 610, a pair of rib-like protrusions 610e are formed in such a manner as to protrude upward. Both the protrusions 610e are linearly formed in such a manner as to extend in the plate width direction of the bus bars 2, and are formed opposite each other in the length direction in the vicinity of the end portion in the length direction of the upper lid portion 610 (the length direction of the bus bars 2). Each of both the protrusions 610e is formed with two locking holes 610f penetrating through both the protrusions 610e in the length direction.

Figure 7:
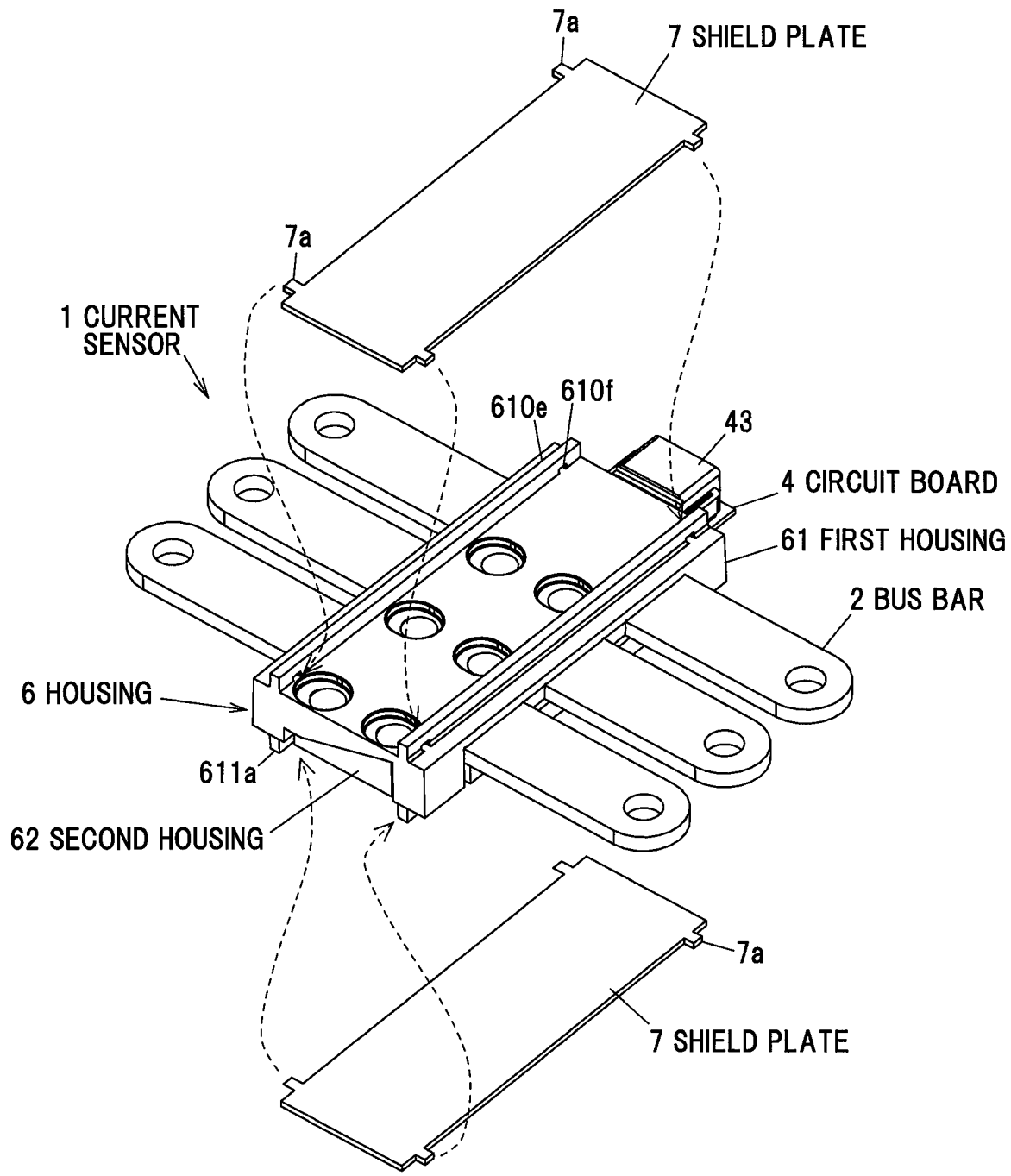
FIG. 7 is an explanatory view for explaining attachment of a shield plate to the housing.

As shown in FIG. 7, a shield plate 7 is fixed to the first housing 61. The shield plate 7 is made of a magnetic material and is for shielding a magnetic field from the outside so that the magnetic field from the outside does not affect the detection result of the magnetic detection elements 3. On the shield plate 7, a locking piece 7a projecting laterally is formed, and by locking the locking piece 7a to the locking hole 610f, the shield plate 7 is fixed to the upper part of the housing 6.

Likewise, rib-shaped protrusions 611a and 612a protruding downward are formed in the first slide guide portion 611 and the side wall portion 612, respectively, and by locking the locking piece 7a to locking holes 611b and 612b (see FIG. 5B) formed in the protrusions 611a and 612a, the other shield plate 7 is fixed to the lower portion of the housing 6. That is, the current sensor 1 has the structure in which the bus bars 2 and the magnetic detection elements 3 are sandwiched between the pair of shield plates 7.

In the current sensor 1, by attaching the shield plates 7 to the housing 6 for fixing the bus bars 2 and the circuit board 4, the shield plate 7 is positioned with respect to the bus bars 2 and the magnetic detection elements 3, and the relative positional relationships between the members are fixed. In the present embodiment, the protrusions 610e, 611a and 612a and the locking holes 610f, 611b and 612b serve as a shield plate holding portion for holding the shield plates 7 to the housing 6.

Returning to FIGS. 5A and 5B, the upper lid portion 610 and the first slide guide portion 611 are formed with an elongated hole 61a for the heat staking protrusion 62a of the second housing 62 to be passed therethrough. In the present embodiment, during assembly, the second housing 62 is slid relative to the first housing 61 in the direction perpendicular to the plate width direction of the bus bars 2. Therefore, the elongated hole 61a is formed in an oval shape (rounded corner rectangular shape) extending in the longitudinal direction of the bus bars 2 so that the heat staking protrusion 62a can be slid. In the present embodiment, a total of six of the elongated holes 61a are formed, four for the upper lid portion 610 and two for the first slide guide portion 611. The elongated holes 61a are formed in such a manner as to penetrate the upper lid portion 610 and the first slide guide portion 611 in the plate thickness direction.

The slide guide portion 611 and the side wall portion 612 are provided in such a manner as to sandwich the three bus bars 2, the spacer 5, and the circuit board 4 therebetween in the plate width direction of the bus bars 2. The side wall portion 612 has a recessed cutout 612c which is open downward so that an end portion of the lower lid portion 620 (described later) of the second housing 62 is inserted into that cutout 612c. Further, in the current sensor 1, when the first and second housings 61 and 62 are combined with each other, a gap is formed between the bottom surface (upper surface) of the cutout 612c on the side wall portion 612 and the second housing 62 (end portion of the lower lid portion 620), and a part of the circuit board 4 (a portion on which the connector 43 is mounted) is extended laterally from that gap. Details of the first slide guide portion 611 will be described later.

As shown in FIG. 6, the second housing 62 integrally includes a plate-like lower lid portion 620 that abuts against the lower surface of the circuit board 4, and a second slide guide portion 621 that is provided on one side of the lower lid portion 620 in the plate width direction of the bus bars 2. Both end portions of the lower lid portion 620 in the longitudinal direction of the bus bars 2 are edge portions 620a formed thicker than the other portions. The second slide guide portion 621 is provided in such a manner as to project upward from the lower lid portion 620. Details of the second slide guide portion 621 will be described later. The lower lid portion 620 and the second slide guide portion 621 are formed with a columnar heat staking protrusion 62a projecting upward. In this embodiment, a total of six heat staking projecting portions 62a are formed, four on the lower lid part 620 and two on the second slide guide part 621.

(Description of Slide Guide Parts 611 and 621)

The slide guide portions 611 and 621 are for allowing the first and second housings 61 and 62 to relatively slide in a direction inclined with respect to the plate thickness direction of the bus bars 2, while abutting each other in the plate thickness direction of the bus bars 2. In the present embodiment, the slide guide portions 611 and 621 are formed in such a manner as to allow the first and second housings 61 and 62 to relatively slide in the direction perpendicular to the plate width direction of the bus bars 2 and inclined with respect to both the plate thickness direction and the length direction of the bus bars 2, while abutting each other in the plate thickness direction of the bus bars 2. In other words, the first and second housings 61 and 62 slide in the plate thickness direction of the bus bars 2 while sliding in the length direction of the bus bars 2.

In the present embodiment, the slide guide portions 611 and 621 include an inclined surface 63*a* and 63*b* respectively whose normal direction is a direction perpendicular to the plate width direction of the bus bars 2 and inclined with respect to the plate thickness direction and the length direction of the bus bars 2. The first slide guide portion 611 provided in the first housing 61 has a recessed cutout 611*c* that is open downward and a surface (upper surface) forming the bottom of the cutout 611*c* is an inclined surface 63*a*. The width of the second slide guide portion 621 provided in the second housing 62 is formed smaller than the width of the cutout 611*c* to allow the slide movement, and the upper surface thereof is the inclined surface 63*b*. The inclination angles of the inclined surfaces 63*a* and 63*b* are the same angles. The angles of inclination of the inclined surfaces 63*a* and 63*b* are not particularly limited, but may appropriately be determined so that the tolerance of each member can be sufficiently absorbed and so that the sliding distance along the length direction of the bus bars 2 does not become too large.

(Description of Assembling Current Sensor 1)

When the current sensor 1 is assembled, the first housing 61 is arranged in a vertically reversed state, and each of bus bars 2 is arranged in the bus bar accommodating groove 610*a* of the first housing 61. At this time, the bus bars 2 are positioned with respect to the first housing 61 by mating the projected portions 610*c* of the first housing 61 to the cutouts 21 of the bus bars 2. Thereafter, the spacer 5 and the circuit board 4 are sequentially stacked on the bus bars 2. At this time, the positioning protrusions 610*d* of the first housing 61 are inserted into the positioning holes 51 and 41 of the spacer 5 and the circuit board 4, and positioning of the spacer 5 and the circuit board 4 with respect to the first housing 61 is performed.

Thereafter, the second housing 62 is stacked on the circuit board 4. At this time, each heat staking protrusion 62*a* is inserted into the corresponding elongated hole 42, 52, and 61*a*. Further, at this time, the inclined surfaces 63*a* and 63*b* of the first slide guide portion 611 and the second slide guide portion 621 are brought into contact with each other.

Figure 8A:
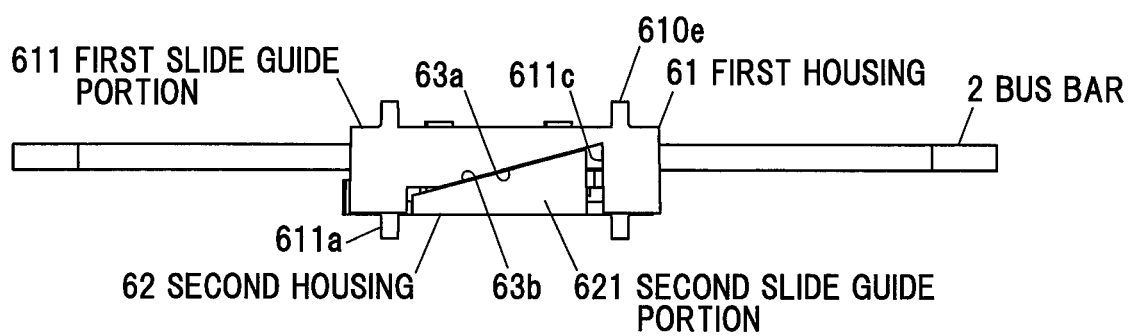
FIG. 8A is a side view before the first and second housings are relatively slid.
Figure 8B:
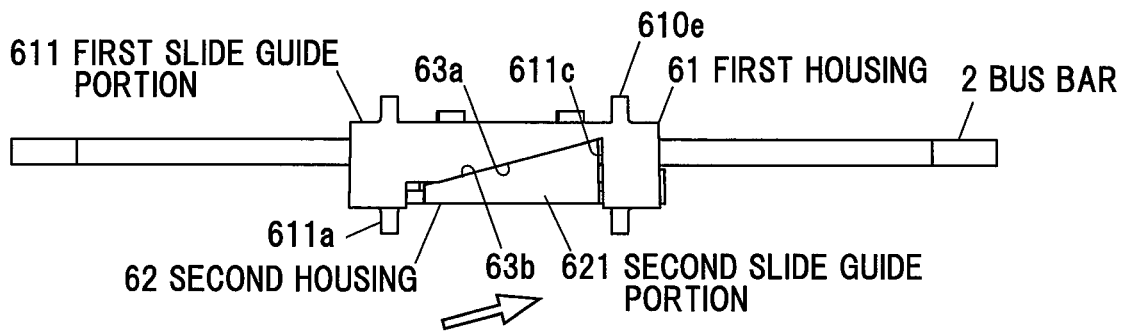
FIG. 8B is a side view after the first and second housings are relatively slid.
Figure 9A:
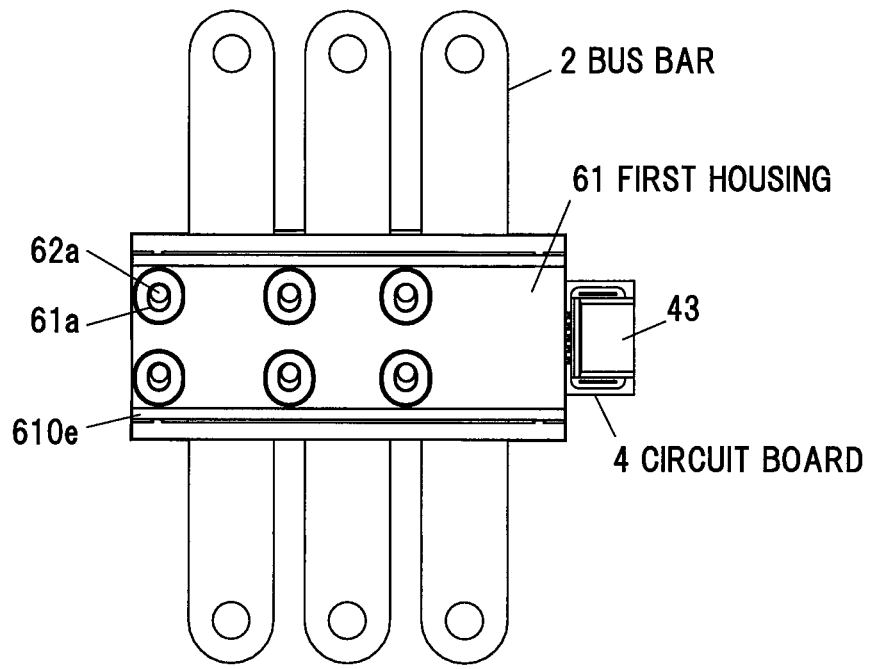
FIG. 9A is a plan view before the first and second housings are relatively slid.
Figure 9B:
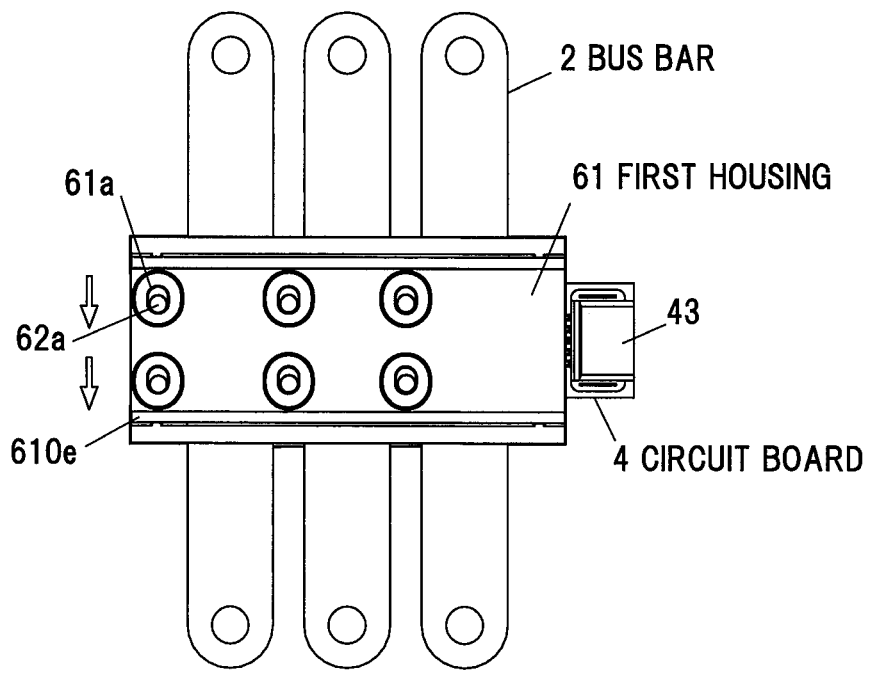
FIG. 9B is a plan view after the first and second housings are relatively slid.
Figure 10A:
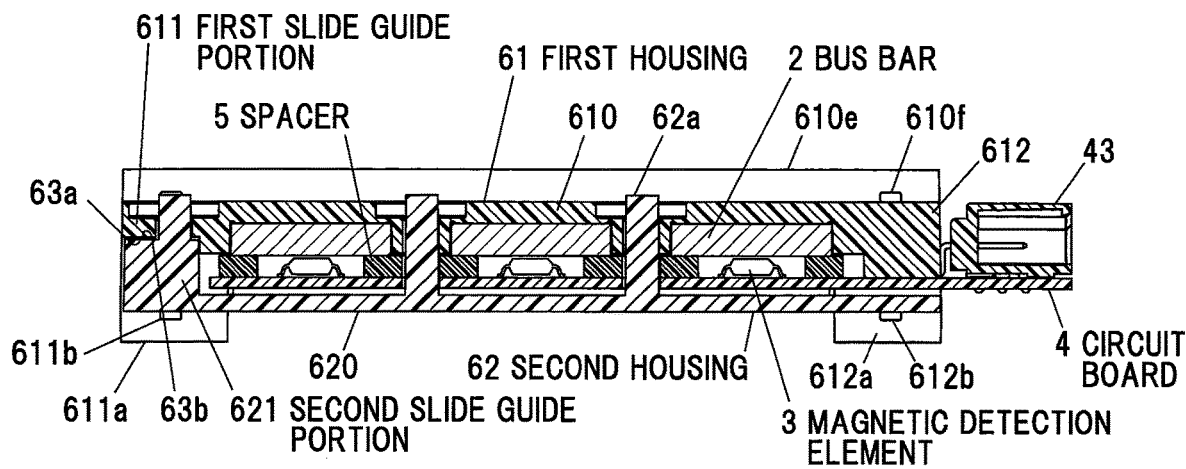
FIG. 10A is a cross-sectional view before the first and second housings are relatively slid.
Figure 10B:
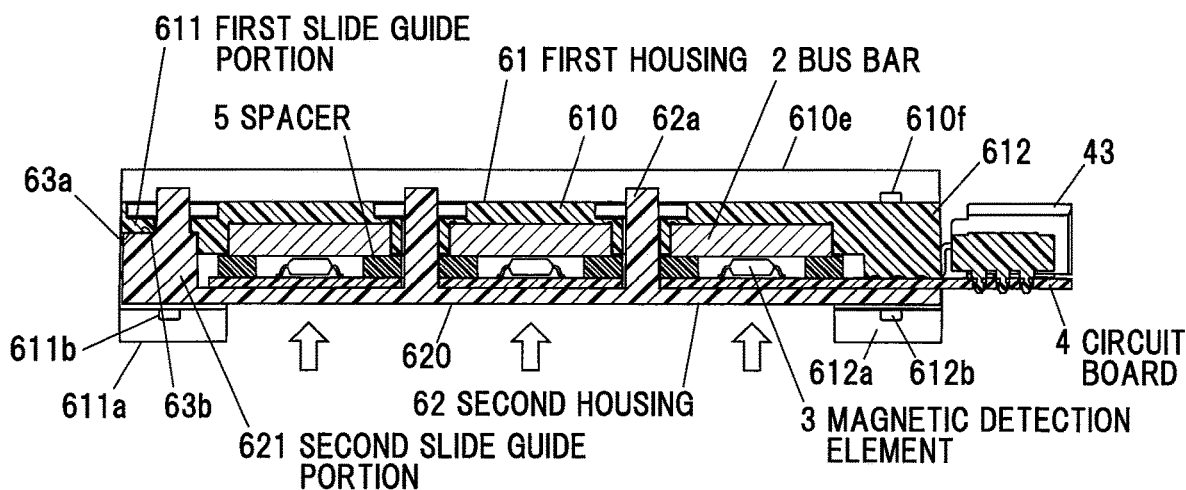
FIG. 10B is a cross-sectional view after the first and second housings are relatively slid.

In this state, when a worker applies a pressing force in the plate thickness direction of the bus bars 2, the inclined surfaces 63*a* and 63*b* are slid against each other, and the second housing 62 is slid relative to the first housing 61. FIG. 8A, FIG. 9A, and FIG. 10A are a side view, a plan view, and a cross-sectional view, respectively, before the first and second housings 61 and 62 are relatively slid. FIG. 8B, FIG. 9B, and FIG. 10B show a side view, a plan view, and a cross-sectional view, respectively, after the first and second housings 61 and 62 are relatively slid.

As shown in FIGS. 8A to 10B, the first and second housings 61 and 62 are moved while being slid relative to each other in the direction along the inclined surfaces 63*a* and 63*b*. That is, the first and second housings 61 and 62 are slid (toward each other) in the plate thickness direction while being slid in the length direction of the bus bars 2. Note that in FIGS. 8B, 9B, and 10B, the sliding direction is indicated by outlined arrows. Thereby, the bus bar 2, the spacer 5, and the circuit board 4 are firmly pressed in the plate thickness direction of the bus bars 2.

In this state, by heating and melting the tips of the heat staking projecting portions 62*a*, heat staking is performed. As a result, the first and second housings 61 and 62 are fixed to each other, and the relative positional relationships between the bus bars 2, the spacer 5, the circuit board 4, the first housing 61, and the second housing 61 are fixed. Thereafter, the shield plates 7 are attached to the housing 61, resulting in the current sensor 1.

Note that in the present embodiment, the first and second housings 61 and 62 are fixed to each other by heat staking, but they may be fixed by bolt fixation using bolts and nuts. Further, from the viewpoint of firmly fixing the first and second housings 61 and 62, it is desirable to fix the first and second housings 61 and 62 at positions where they abut each other. That is, it is preferable that the first and second housings 61 and 62 are fixed to each other at least in the slide guide portions 611 and 621 by bolt fixation or heat staking. In the present embodiment, the slide guide portions 611 and 621 are heat staked at two areas thereon to fix the first and second housings 61 and 62 to each other.

Operation and Advantageous Effects of the Embodiment

As described above, the current sensor 1 according to the present embodiment has the housing 6 including the first and second housings 61 and 62 provided in such a manner as to sandwich the bus bars 2 and the circuit board 4 therebetween in the plate thickness direction of the bus bars 2, and the first housing 61 and the second housing 62 include the slide guide portions 611 and 621 relatively slidable in a sloping (inclined) direction with respect to the plate thickness direction of the bus bars 2 while abutting against each other in the plate thickness direction of the bus bars 2.

As a result, it is possible to absorb the manufacturing tolerance, and press down the bus bars 2 and the circuit board 4 with the first and second housings 61 and 62, to keep the distance between the bus bars 2 and the circuit board 4 (magnetic detecting elements 3) constant. In addition, since the first and second housings 61 and 62 are in contact with each other in the plate thickness direction of the bus bars 2 even after the sliding thereof (that is, they hold the contact therebetween even when being pressed), it is possible to suppress the deformation of the housing 6 as in the conventional technique, suppress the inclination of the members due to the biasing of the pressing force, and suppress the positional misalignment between the bus bars 2 and the magnetic detecting elements 3. That is, according to the present embodiment, even when a sufficient pressing force is applied between the first and second housings 61 and 62, the deformation of the housings 61 and 62 is unlikely to occur, and it is possible to realize the current sensor 1 capable of suppressing the positional misalignment between the bus bars 2 and the magnetic detection elements 3. As a result, it is possible to realize the current sensor 1 in which the characteristic deterioration such as a decrease in the detection sensitivity due to the positional misalignment is suppressed.

Summary of the Embodiment

Next, the technical ideas grasped from the above-described embodiments will be described with the aid of reference numerals and the like in the embodiments. It should be noted, however, that each of the reference numerals and the like in the following description does not limit the constituent elements in the claims to the members and the like specifically shown in the embodiments.

[1] A current sensor (1), comprising: a bus bar (2) in which a current to be detected flows; a circuit board (4) mounted with a magnetic detection element (3) thereon to detect a strength of a magnetic field generated by a current flowing in the bus bar (2); and a housing (6) including first and second housings (61, 62) provided in such a manner as to sandwich the bus bar (2) and the circuit board (4) therebetween in a plate thickness direction of the bus bar (2), wherein the first and second housings (61, 62) include slide guide portions (611, 621) respectively which are relatively slidable in a sloping direction with respect to the plate thickness direction of the bus bar (2) while abutting each other in the plate thickness direction of the bus bar (2).

[2] The current sensor (1) according to [1] above, wherein the slide guide portions (611, 621) are formed to allow the first and second housings (61, 62) to relatively slide in a direction perpendicular to a plate width direction of the bus bar (2) and inclined with respect to both the plate thickness direction and a length direction of the bus bar (2), while abutting each other in the plate thickness direction of the bus bar (2).

[3] The current sensor (1) according to [1] or [2] above, wherein the slide guide portions (611, 621) include an inclined surface (63a, 63b) whose normal direction is a direction perpendicular to a plate width direction of the bus bar (2) and inclined with respect to the plate thickness direction and a length direction of the bus bar (2).

[4] The current sensor (1) according to any one of [1] to [3] above, further comprising a spacer (5) provided between the bus bar (2) and the circuit board (4) to maintain the bus bar (2) and the circuit board (4) at a predetermined distance therebetween.

[5] The current sensor (1) according to any one of [1] to [4] above, including a plurality of the bus bars (2), wherein the circuit board (4) is mounted with a plurality of the magnetic detection elements (3) thereon corresponding to the plurality of the bus bars (2) respectively, and the first and second housings (61, 62) are provided in such a manner as to sandwich the plurality of the bus bars (2) and the circuit board (4) together therebetween.

[6] The current sensor (1) according to any one of [1] to [5] above, further comprising a pair of shield plates (7) provided in such a manner as to sandwich the bus bar (2) and the circuit board (4) together therebetween in the plate thickness direction, wherein the housing (6) includes a shield plate holding portion that holds the shield plates (7) on an outer surface in the plate thickness direction of the bus bar (2).

[7] The current sensor (1) according to any one of [1] to [6] above, wherein the first and second housings (61, 62) are fixed to each other at least in the slide guide portions (611, 621) by bolt fixation or heat staking.

Although the embodiment of the present invention has been described above, the embodiment described above does not limit the invention according to the claims. It should also be noted that not all combinations of the features described in the embodiments are indispensable to the means for solving the problem of the invention.

The present invention can be appropriately modified and carried out within the scope not deviating from the spirit thereof. For example, in the above-described embodiment, the slide guide portions 611 and 621 are slid by sliding between the inclined surfaces 63a and 63b, but the structure for sliding the first and second housings 61 and 62 relative to each other is not limited to this. For example, one housing may be provided with an inclined surface, while the other housing may be provided with a protrusion or the like which is guided and moved by the inclined surface. In this case, however, it is desirable to provide a plurality of the protrusions in order to prevent the first and second housings 61 and 62 from being inclined and fixed. In addition, e.g., a stepped surface may be formed instead of the inclined surfaces 63a and 63b.

In addition, although in the above embodiment, the first and second housings 61 and 62 are slid in the plate thickness direction of the bus bars 2 while being slid in the longitudinal direction of the bus bars 2, the sliding directions of both the housings 61 and 62 are not limited to this, but may be in a sloping direction with respect to the plate thickness direction of the bus bars 2 (however, the direction perpendicular to the plate thickness direction of the bus bars 2 is excluded). For example, the first and second housings 61 and 62 may be configured to be slid in the plate thickness direction of the bus bars 2 while being slid in the plate width direction of the bus bars 2.

Furthermore, although in the above embodiment, it has been described that the slide guide portions 611 and 621 are provided at only one end in the width direction of the housing 2 (the plate width direction of the bus bars 2) for the convenience of providing the connector 43, it is not limited to this, but the slide guide portions 611 and 621 may be provided at both the ends in the width direction of the housing 2. Further, three or more portions 611 and 621 may be provided in the housing 2.

Furthermore, although in the above embodiment, the case of using the spacer 5 has been described, the spacer 5 is not indispensable but can be omitted. For example, in the case where a through hole is formed in the bus bars 2 and the magnetic detection elements 3 are arranged within the through holes, the bus bars 2 and the circuit board 4 may be directly brought into contact with each other without interposing the spacer 5 therebetween.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A current sensor, comprising:
    a bus bar in which a current to be detected flows;
    a circuit board mounted with a magnetic detection element thereon to detect a strength of a magnetic field generated by a current flowing in the bus bar; and
    a housing including first and second housings provided in such a manner as to sandwich the bus bar and the circuit board therebetween in a plate thickness direction of the bus bar,
    wherein the first and second housings include slide guide portions respectively which are relatively slidable in a sloping direction with respect to the plate thickness direction of the bus bars while abutting each other in the plate thickness direction of the bus bar, and
    wherein the current sensor further comprises a plurality of bus bars,
    wherein the circuit board is mounted with a plurality of the magnetic detection elements thereon corresponding to the plurality of the bus bars respectively, and the first and second housings are provided in such a manner as to sandwich the plurality of the bus bars and the circuit board together therebetween.

2. The current sensor according to claim 1, wherein the slide guide portions are formed to allow the first and second housings to relatively slide in a direction perpendicular to a plate width direction of the bus bars and inclined with respect to both the plate thickness direction and a length direction of the bus bars, while abutting each other in the plate thickness direction of the bus bars.

3. The current sensor according to claim 1, wherein the slide guide portions include an inclined surface whose normal direction is a direction perpendicular to a plate width direction of the bus bars and inclined with respect to the plate thickness direction and a length direction of the bus bars.

4. The current sensor according to claim 1, further comprising a spacer provided between the bus bars and the circuit board to maintain the bus bars and the circuit board at a predetermined distance therebetween.

5. The current sensor according to claim 1, further comprising a pair of shield plates provided in such a manner as to sandwich the bus bars and the circuit board together therebetween in the plate thickness direction, wherein the housing includes a shield plate holding portion that holds the shield plates on an outer surface in the plate thickness direction of the bus bars.

6. The current sensor according to claim 1, wherein the first and second housings are fixed to each other at least in the slide guide portions by bolt fixation or heat staking.

7. A current sensor, comprising:
a bus bar in which a current to be detected flows;
a circuit board mounted with a magnetic detection element thereon to detect a strength of a magnetic field generated by a current flowing in the bus bar; and
a housing including first and second housings provided in such a manner as to sandwich the bus bar and the circuit board therebetween in a plate thickness direction of the bus bar,
wherein the first and second housings include slide guide portions respectively which are relatively slidable in a sloping direction with respect to the plate thickness direction of the bus bar while abutting each other in the plate thickness direction of the bus bar, and
further comprising a pair of shield plates provided in such a manner as to sandwich the bus bar and the circuit board together therebetween in the plate thickness direction, wherein the housing includes a shield plate holding portion that holds the shield plates on an outer surface in the plate thickness direction of the bus bar.

8. The current sensor according to claim 7, wherein the slide guide portions are formed to allow the first and second housings to relatively slide in a direction perpendicular to a plate width direction of the bus bar and inclined with respect to both the plate thickness direction and a length direction of the bus bar, while abutting each other in the plate thickness direction of the bus bar.

9. The current sensor according to claim 7, wherein the slide guide portions include an inclined surface whose normal direction is a direction perpendicular to a plate width direction of the bus bar and inclined with respect to the plate thickness direction and a length direction of the bus bar.

10. The current sensor according to claim 7, further comprising a spacer provided between the bus bar and the circuit board to maintain the bus bar and the circuit board at a predetermined distance therebetween.

11. The current sensor according to claim 7, wherein the first and second housings are fixed to each other at least in the slide guide portions by bolt fixation or heat staking.

* * * * *